(12) United States Patent
Peng et al.

(10) Patent No.: US 12,016,235 B2
(45) Date of Patent: Jun. 18, 2024

(54) DISPLAY MODULE, DISPLAY PANEL THINNING METHOD, DISPLAY PANEL, AND DISPLAY DEVICE

(71) Applicants: Ordos Yuansheng Optoelectronics Co., Ltd., Ordos (CN); BOE Technology Group Co., Ltd., Beijing (CN)

(72) Inventors: Liman Peng, Beijing (CN); Yan Wu, Beijing (CN); Qianqian Zhang, Beijing (CN); Zhiyong Xue, Beijing (CN); Liang Tang, Beijing (CN); Guoping Zhang, Beijing (CN); Qiang Chen, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 600 days.

(21) Appl. No.: 17/418,137

(22) PCT Filed: Dec. 31, 2020

(86) PCT No.: PCT/CN2020/142034
§ 371 (c)(1),
(2) Date: Jun. 24, 2021

(87) PCT Pub. No.: WO2021/136487
PCT Pub. Date: Jul. 8, 2021

(65) Prior Publication Data
US 2023/0135576 A1    May 4, 2023

(30) Foreign Application Priority Data

Jan. 2, 2020    (CN) .......................... 202010001201.9

(51) Int. Cl.
*H10K 59/40*    (2023.01)
*H10K 59/80*    (2023.01)

(52) U.S. Cl.
CPC ......... *H10K 59/40* (2023.02); *H10K 59/8722* (2023.02)

(58) Field of Classification Search
CPC .... H10K 59/40; H10K 59/8722; H10K 71/40; H10K 50/844; H10K 50/84; H10K 50/841; G06F 3/041; H05B 22/04
See application file for complete search history.

(56) References Cited

U.S. PATENT DOCUMENTS 11,247,449 B2 * 2/2022 Wei ........................... G09F 9/00
2015/0097810 A1    4/2015 Aoki et al.
(Continued)

FOREIGN PATENT DOCUMENTS

CN    103440067 A    12/2013
CN    106746705 A    5/2017
(Continued)

OTHER PUBLICATIONS

CN202010001201.9 first office action.

*Primary Examiner* — Anne M Hines
*Assistant Examiner* — Jose M Diaz
(74) *Attorney, Agent, or Firm* — IPro, PLLC

(57) ABSTRACT

The present disclosure provides a display module, a display panel thinning method, a display panel, and a display device. The display module provided by the present disclosure includes: a display panel, a protective film located on a to-be-protected face of the display panel, a first anti-acid film located on the protective film, a second anti-acid film located on the first anti-acid film, and a sealant.

17 Claims, 5 Drawing Sheets

(56) References Cited

U.S. PATENT DOCUMENTS

2015/0301666 A1 10/2015 Yang et al.
2021/0170736 A1 6/2021 Wei

FOREIGN PATENT DOCUMENTS

| CN | 106816096 | A | 6/2017 |
| CN | 107336490 | A | 11/2017 |
| CN | 108011053 | A | 5/2018 |
| CN | 108845712 | A | 11/2018 |
| CN | 109709707 | A | 5/2019 |
| KR | 101655847 | B1 | 9/2016 |
| KR | 20170080756 | A | 7/2017 |

* cited by examiner

DISPLAY MODULE, DISPLAY PANEL THINNING METHOD, DISPLAY PANEL, AND DISPLAY DEVICE

CROSS REFERENCE TO RELATED APPLICATIONS

The present disclosure is a US National Stage of International Application No. PCT/CN2020/142034, filed Dec. 31, 2020, which claims priority of the Chinese Patent Application No. 202010001201.9, filed to the Chinese Patent Office on Jan. 2, 2020, entitled "Display Module, Display Panel Thinning Method, Display Panel, and Display Device", of which the entire contents are incorporated herein by reference.

FIELD

The present disclosure relates to the field of display, in particular to a display module, a display panel thinning method, a display panel, and a display device.

BACKGROUND

Organic light-emitting diode (OLED) display products have advantages of self light emitting, high efficiency, low working voltage, light weight and thinness, flexibility and the like, and therefore are widely applied in the field of display, etc. A touch function is broadly applied in display devices, for example, a touch screen panel (TSP) may be disposed on an OLED panel.

SUMMARY

An embodiment of the present disclosure provides a display module. The display module includes: a display panel, including a to-be-thinned substrate and a touch substrate opposite to each other, where a surface, facing away from the to-be-thinned substrate, of the touch substrate is a to-be-protected face, and the to-be-thinned substrate is divided into a to-be-thinned region and a non-thinned region in a direction pointing from the to-be-thinned substrate to the touch substrate; a protective film, located on a to-be-protected face of the display panel, where the protective film covers a part of the to-be-protected face; a first anti-acid film, located on a surface of one side of the protective film facing away from the to-be-protected face, where an orthographic projection of the first anti-acid film on the to-be-protected face falls in the to-be-protected face, and an orthographic projection of the protective film on the first anti-acid film falls in the first anti-acid film; a second anti-acid film, located on a surface of one side of the first anti-acid film facing away from the to-be-protected face, where an orthographic projection of the second anti-acid film on the to-be-protected face falls in the to-be-protected face, and an orthographic projection of the first anti-acid film on the second anti-acid film falls in the second anti-acid film; and a sealant, covering a region of the to-be-protected face not covered by the protective film, a side face of the touch substrate and a side face of the non-thinned region.

Optionally, the orthographic projection of the protective film on the first anti-acid film falls in the first anti-acid film and is smaller than the first anti-acid film; and the orthographic projection of the first anti-acid film on the second anti-acid film falls in the second anti-acid film and is smaller than the second anti-acid film.

Optionally, the sealant completely covers a side face of the protective film and a side face of the first anti-acid film; and a space between the region of the first anti-acid film not covered by the protective film, and the to-be-protected face is filled with the sealant; and a space between the region of the second anti-acid film not covered by the first anti-acid film and the to-be-protected face is filled with the sealant.

Optionally, in a direction perpendicular to the to-be-protected face, a thickness of the sealant is greater than a thickness of the touch substrate, and a total thickness of a region of the display module not covered by the sealant is greater than or equal to a thickness of the to-be-thinned region.

Optionally, the to-be-protected face has first sides parallel to a first direction and second sides parallel to a second direction; a distance from an edge of the protective film to the closest first side is approximately: 17-27 mm, and a distance from the edge of the protective film to the closest second side is approximately: 14-24 mm; and where the first direction and the second direction cross each other.

Optionally, a distance from an edge of the first anti-acid film to the closest first side is approximately: 2-18 mm, and a distance from the edge of the first anti-acid film to the closest second side is approximately: 2-20 mm.

Optionally, a distance from an edge of the second anti-acid film to the closest first side is approximately less than or equal to 0.5 mm, and a distance from an edge of the second anti-acid film to the closest second side is approximately less than or equal to 0.5 mm.

Optionally, the orthographic projection of the second anti-acid film on the to-be-protected face coincides with the to-be-protected face.

Optionally, the protective film is glass spacer paper; and a material of the first anti-acid film and a material of the second anti-acid film include polyethylene terephthalate.

A display panel thinning method provided by an embodiment of the present disclosure includes: attaching a protective film to a to-be-protected face of a display panel, where the display panel includes: a to-be-thinned substrate and a touch substrate opposite to each other, the to-be-protected face is a surface of the touch substrate facing away from the to-be-thinned substrate, the to-be-thinned substrate is divided into a to-be-thinned region and a non-thinned region in a direction pointing from the to-be-thinned substrate to the touch substrate, and the protective film covers a part of the to-be-protected face; attaching a first anti-acid film to one side of the protective film facing away from the to-be-protected face, where an orthographic projection of the first anti-acid film on the to-be-protected face falls in the to-be-protected face, and an orthographic projection of the protective film on the first anti-acid film falls in the first anti-acid film; attaching a second anti-acid film to one side of the first anti-acid film facing away from the protective film, where an orthographic projection of the second anti-acid film on the to-be-protected face falls in the to-be-protected face, and an orthographic projection of the first anti-acid film on the second anti-acid film falls in the second anti-acid film; and coating a region of the to-be-protected face not covered by the protective film, a side face of the touch substrate and a side face of the non-thinned region with a sealant, and curing the sealant.

Optionally, coating the region of the to-be-protected face not covered by the protective film with the sealant specifically includes: coating the region of the to-be-protected face not covered by the protective film with the sealant such that the sealant completely covers a side face of the protective film and a side face of the first anti-acid film.

Optionally, coating the side face of the touch substrate and the side face of the non-thinned region with the sealant specifically includes: coating the side face of the touch substrate and the side face of the non-thinned region with the sealant such that in a direction perpendicular to the to-be-protected face, a thickness of the sealant is greater than a thickness of the touch substrate, and a total thickness of a region of the display module not covered by the sealant is greater than or equal to a thickness of the to-be-thinned region.

Optionally, after curing the sealant, the method further includes: placing the display panel into an isolation frame, where the isolation frame has spacer parts, the spacer parts support the display panel on one side of the second anti-acid film facing away from the to-be-thinned region, and the spacer parts are not in contact with the to-be-thinned region; and placing the isolation frame into a thinning pool containing a thinning liquid, and corroding the to-be-thinned region.

Optionally, placing the display panel into the isolation frame specifically includes: placing the plurality of display panels into the same isolation frame, where adjacent display panels are spaced by the spacer parts.

Optionally, after corroding the to-be-thinned region, the method further includes: cleaning the thinned display panel; and removing the second anti-acid film, the first anti-acid film, the protective film and the sealant.

An embodiment of the present disclosure further provides a display panel, which is obtained after a to-be-thinned region is thinned by the display panel thinning method provided by the embodiment of the present disclosure.

An embodiment of the present disclosure further provides a display device. The display device includes the display panel provided by the embodiment of the present disclosure.

DETAILED DESCRIPTION OF THE EMBODIMENTS

To make the objectives, technical solutions and advantages of the present disclosure clearer, a further detailed description of the present disclosure will be given below with reference to the accompanying drawings. Apparently, the described embodiments are only a part, but not all, of the embodiments of the present disclosure. All of the other embodiments, obtained by those of ordinary skill in the art based on the embodiments of the present disclosure without any inventive efforts, fall into the protection scope of the present disclosure.

Shapes and sizes of all parts in the accompanying drawings do not reflect the true scale and are only intended to schematically illustrate the contents of the present disclosure.

In a process for thinning an OLED glass substrate in a related art, glass is mainly subjected to stripping and thinning by an acid liquid soaking mode. When a single side of glass needs to be thinned, an anti-acid film needs to be attached to the side not needing to be thinned to protect this side. For example, in order to prevent a touch electrode of a TSP from being corroded, a layer of anti-acid film needs to be attached to a surface of the TSP. However, although the layer of anti-acid film is attached, acid seepage may still occur during the thinning process, which causes improper corrosion to the TSP, consequently causes a poor electrical touch character of products and affects a preparation yield of the products.

Figure 1:
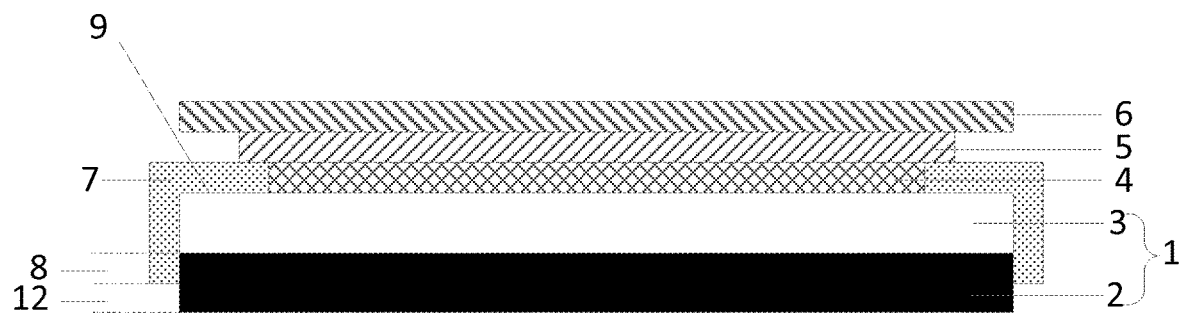
FIG. 1 is a schematic structural diagram of a display module provided by an embodiment of the present disclosure.

A display module provided by an embodiment of the present disclosure, as shown in FIG. 1, includes: a display panel 1, a protective film 4 located on a to-be-protected face 9 of the display panel 1, a first anti-acid film 5 located on the protective film 4, a second anti-acid film 6 located on the first anti-acid film 5, and a sealant 7.

Further, as shown in FIG. 1, the display panel 1 includes: a to-be-thinned substrate 2 and a touch substrate 3 opposite to each other, the to-be-protected face 9 is a surface of the touch substrate 3 facing away from the to-be-thinned substrate 2, and the to-be-thinned substrate 2 is divided into a to-be-thinned region 12 and a non-thinned region 8 in a direction pointing from the to-be-thinned substrate 2 to the touch substrate 3.

Figure 4:
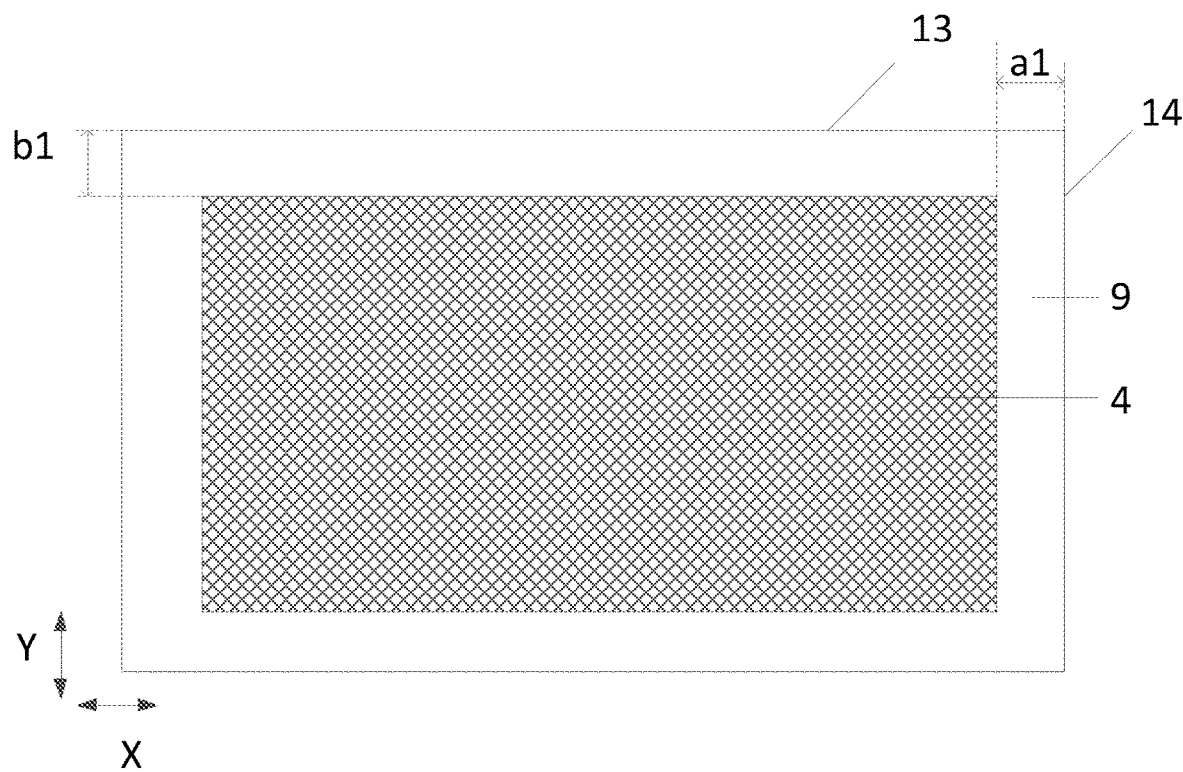
FIG. 4 is a schematic diagram of an orthographic projection of a protective film on a to-be-protected face in a display module provided by an embodiment of the present disclosure.

In some embodiments, as shown in FIG. 4, the protective film 4 at least partially covers the to-be-protected face 9.

Figure 5:
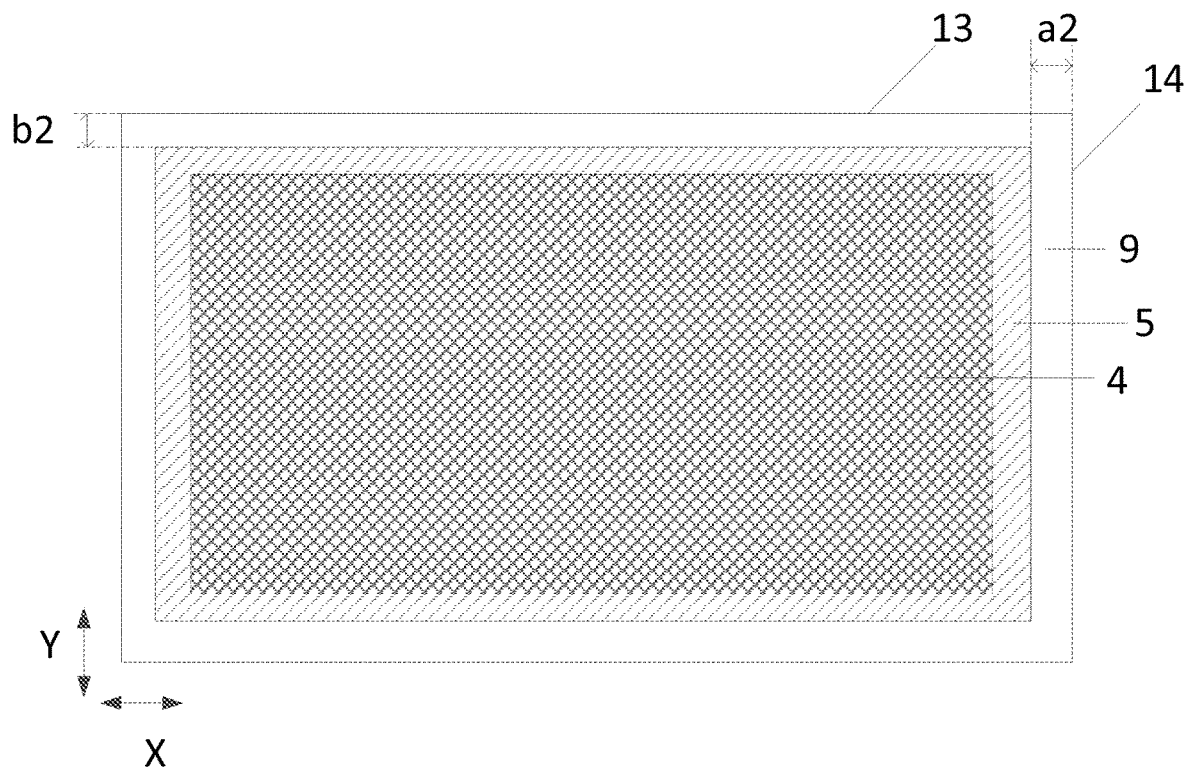
FIG. 5 is a schematic diagram of an orthographic projection of a first anti-acid film on a to-be-protected face in a display module provided by an embodiment of the present disclosure.

In some embodiments, as shown in FIG. 5, an orthographic projection of the first anti-acid film 5 on the to-be-protected face 9 falls in the to-be-protected face 9. In some embodiments, as shown in FIG. 5, the orthographic projection of the first anti-acid film 5 on the to-be-protected face 9 falls in the to-be-protected face 9, and an orthographic projection of the protective film 4 on the first anti-acid film 5 falls in the first anti-acid film 5.

Figure 6A:
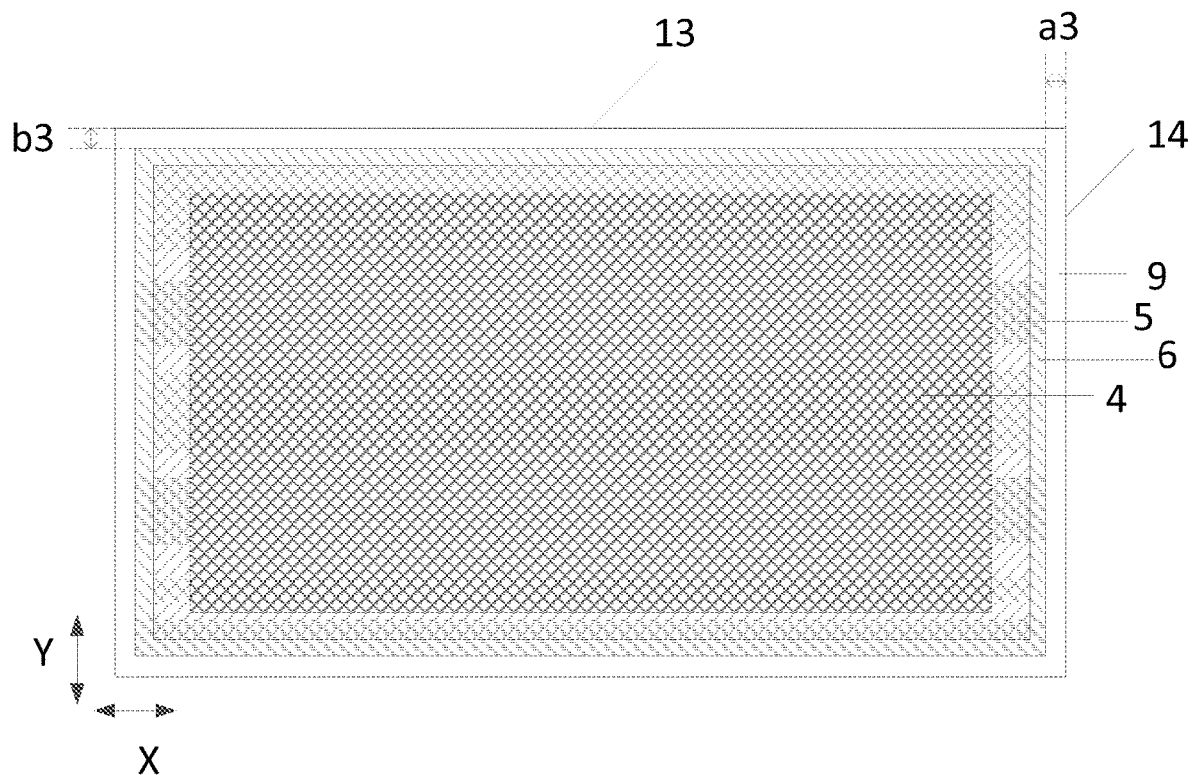
FIG. 6A is a schematic diagram of an orthographic projection of a second anti-acid film on a to-be-protected face in a display module provided by an embodiment of the present disclosure.

In some embodiments, as shown in FIG. 6A, an orthographic projection of the second anti-acid film 6 on the to-be-protected face 9 falls in the to-be-protected face 9. In some embodiments, as shown in FIG. 6A, the orthographic projection of the second anti-acid film 6 on the to-be-protected face 9 falls in the to-be-protected face 9, and an orthographic projection of the first anti-acid film 5 on the second anti-acid film 6 falls in the second anti-acid film 6.

Figure 6B:
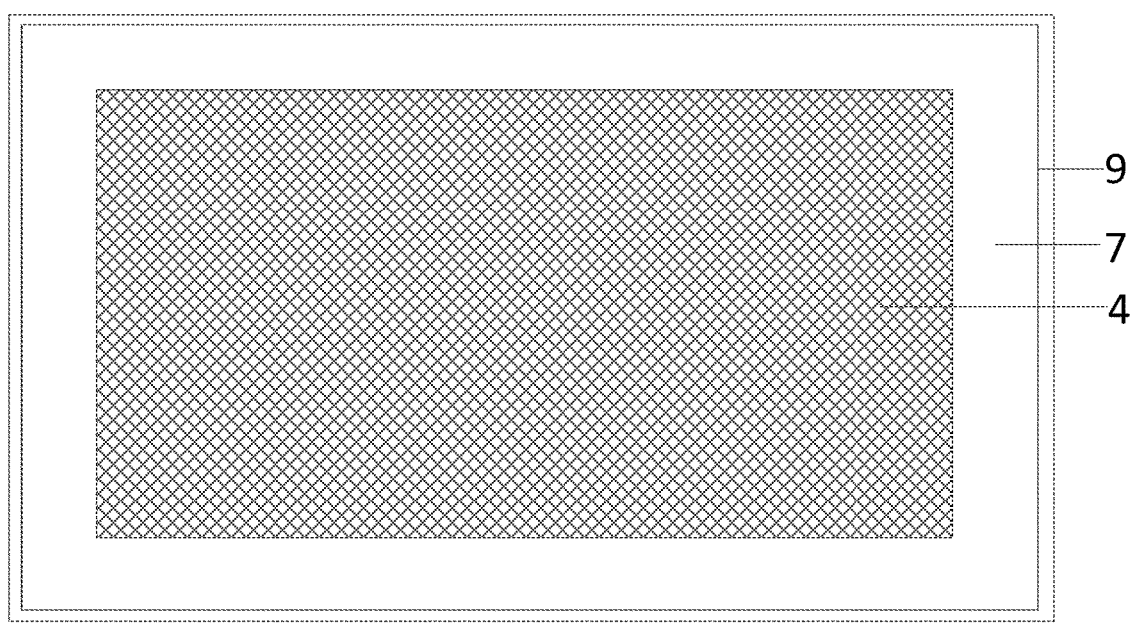
FIG. 6B is a schematic diagram of an orthographic projection of a sealant on a to-be-protected face in a display module provided by an embodiment of the present disclosure.

In some embodiments, as shown in FIG. 6B, the sealant 7 at least covers a region of the to-be-protected face 9 not covered by the protective film 4. In some embodiments, the sealant 7 covers the region of the to-be-protected face 9 not covered by the protective film 4, a side face of the touch substrate 3 and a side face of the non-thinned region 8.

Specifically, as shown in FIG. 6A, an orthographic projection of the protective film 4 on the first anti-acid film 5 falls in the first anti-acid film 5 and is generally smaller than the first anti-acid film 5; and the orthographic projection of the first anti-acid film 5 on the second anti-acid film 6 falls in the second anti-acid film 6 and is smaller than the second anti-acid film 6.

In the display module provided by the embodiment of the present disclosure, the first anti-acid film and the second anti-acid film are attached to the to-be-protected face of the display panel in sequence, an area of the first anti-acid film is less than an area of the to-be-protected face, and an area of the second anti-acid film is greater than the area of the first anti-acid film, thereby at least avoiding the problem that acid seeps subsequently during thinning the display module and consequently corrodes the to-be-protected face.

In the display module provided by the embodiment of the present disclosure, the protective film, the first anti-acid film and the second anti-acid film are attached to the to-be-protected face of the display panel in sequence, and the protective film may prevent the to-be-protected face from being contaminated during the attaching process of the first anti-acid film. The first anti-acid film and the second anti-acid film are attached, the area of the first anti-acid film is less than the area of the to-be-protected face, the area of the second anti-acid film is greater than the area of the first anti-acid film, and the sealant covers the region of the to-be-protected face not covered by the protective film, the side face of the touch substrate and the side face of the non-thinned region, thereby remarkably improving the protecting effect of the sealant, and further avoiding the problem that the acid seeps during thinning the display module and consequently corrodes the to-be-protected face.

It should be noted that a structure between the to-be-thinned substrate 2 and the touch substrate 3 is not shown in FIG. 1.

In some embodiments, the sealant at least partially covers the side face of the protective film 4.

Optionally, in the display module provided by the embodiment of the present disclosure, as shown in FIG. 1, the sealant 7 may only completely cover the side face of the protective film 4.

Figure 2:
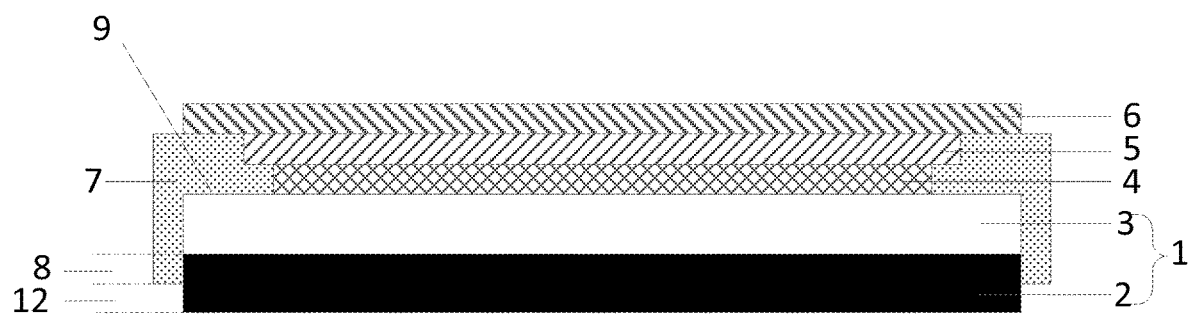
FIG. 2 is a schematic structural diagram of another display module provided by an embodiment of the present disclosure.
Figure 3:
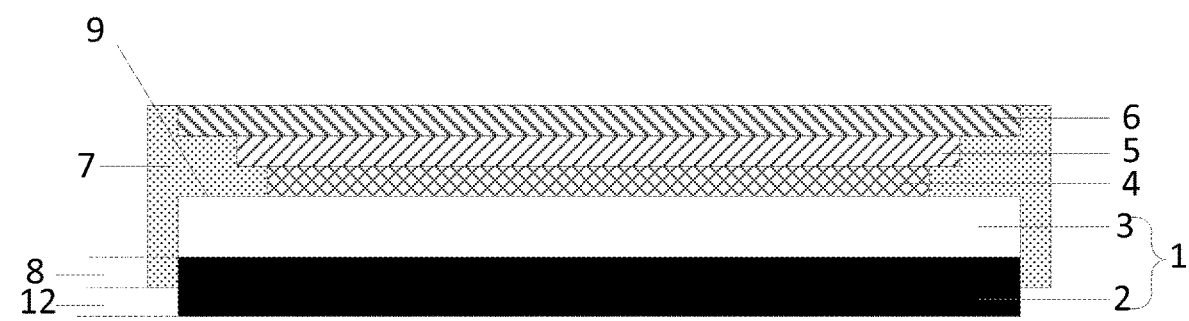
FIG. 3 is a schematic structural diagram of further another display module provided by an embodiment of the present disclosure.

Or optionally, in the display module provided by the embodiment of the present disclosure, as shown in FIG. 2 and FIG. 3, the sealant may completely cover the side face of the protective film 4 and a side face of the first anti-acid film 5; a space between the region of the first anti-acid film 5 not covered by the protective film 4 and the to-be-protected face 9 is filled with the sealant 7; and a space between the region of the second anti-acid film 6 not covered by the first anti-acid film 5 and the to-be-protected face 9 is filled with the sealant 7.

It should be noted that the effect of preventing acid seepage is theoretically good when the area of the first anti-acid film is greater than the area of the second anti-acid film, and acid seepage easily occurs theoretically when the area of the first anti-acid film is less than the area of the to-be-protected face and the second anti-acid film. An inventor of the present disclosure however finds that acid seepage will not occur at all during a thinning process when the area of the first anti-acid film is less than the area of the to-be-protected face and the second anti-acid film, and design modes for sizes of the first anti-acid film and the second anti-acid film except for the solution provided by the present disclosure may all cause acid seepage of different degrees, thereby affecting a preparation yield of the display panel.

Specifically, in the display module provided by the embodiment of the present disclosure, the area of the first anti-acid film is less than the area of the to-be-protected face, the area of the second anti-acid film is greater than the area of the first anti-acid film, a groove is designed in a periphery between the first anti-acid film and the to-be-protected face, and the groove may be filled with the sealant, thereby remarkably improving the protecting effect of the sealant and preventing undercut of an acid liquid, and accordingly acid seepage will not occur at all during the thinning process.

Optionally, in the display module provided by the embodiment of the present disclosure, as shown in FIG. 3, the sealant 7 may further cover the side face of the second anti-acid film 6.

Specifically, the sealant 7 is disposed on a side face of the display module and in a groove formed among the protective film 4, the first anti-acid film 5, the second anti-acid film 6 and the to-be-protected face 9 such that a sealing effect of the sealant 7 on the display module may be further improved.

Optionally, in the display module provided by the embodiment of the present disclosure, as shown in FIG. 1 to FIG. 3, in a direction perpendicular to the to-be-protected face 9, a thickness of the sealant 7 will be greater than a thickness of the touch substrate 3, thereby completely protecting the touch substrate 3 from being not etched by the acid liquid; and a total thickness of the region of the display module not covered by the sealant 7 is greater than or equal to a thickness of the to-be-thinned region 12, thereby ensuring that the to-be-thinned region 12 is completely exposed to be etched by the acid liquid.

Optionally, in the display module provided by the embodiment of the present disclosure, as shown in FIG. 4 to FIG. 6A, the to-be-protected face 9 has first sides 13 parallel to a first direction X and second sides 14 parallel to a second direction Y, where the first direction X and the second direction Y cross each other. In FIG. 4 to FIG. 6A, the to-be-protected face 9 is a rectangle, the first direction X and the second direction Y are perpendicular to each other, the first sides 13 are long sides of the rectangle, and the second sides 14 are short sides of the rectangle.

As shown in FIG. 4, a distance from an edge of the protective film 4 to the closest first side 13 is b1, and a distance from the edge of the protective film 4 to the closest second side 14 is a1. As shown in FIG. 5, a distance from an edge of the first anti-acid film 5 to the closest first side 13 is b2, and a distance from the edge of the first anti-acid film 5 to the closest second side 14 is a2. As shown in FIG. 6A, a distance from an edge of the second anti-acid film 6 to the closest first side 13 is b3, and a distance from an edge of the second anti-acid film 6 to the closest second side 14 is a3.

Optionally, the distance b1 from the edge of the protective film 4 to the closest first side 13 is approximately: 17-27 mm, and the distance a1 from the edge of the protective film 4 to the closest second side 14 is approximately: 14-24 mm.

Optionally, the distance b2 from the edge of the first anti-acid film 5 to the closest first side 13 is approximately:

2-18 mm, and the distance a2 from the edge of the first anti-acid film 5 to the closest second side 14 is approximately: 2-20 mm.

Optionally, the distance from the edge of the second anti-acid film 6 to the closest first side 13 is approximately less than or equal to 0.5 mm, and the distance from the edge of the second anti-acid film 6 to the closest second side 14 is approximately less than or equal to 0.5 mm.

The term approximate herein refers to data within a range of allowable process and measurement errors, not strictly limited, and allowing some degree of numerical floating, e.g., within 10% up and down.

In specific implementation, shapes of the to-be-protected face 9, the protective film 4, the first anti-acid film 5 and the second anti-acid film 6 may each be a rectangle, long sides of the rectangle are parallel to the first direction, and short sides of the rectangle are parallel to the second direction. For example, the to-be-protected face 9 has a long side size of approximately 750 mm and a short side size of approximately 650 mm, the distance from the edge of the protective film 4 to the closest long side of the to-be-protected face 9 is approximately 22 mm, the distance from the edge of the protective film 4 to the closest short side of the to-be-protected face 9 is approximately 19 mm, the distance from the edge of the first anti-acid film 5 to the closest long side of the to-be-protected face 9 is approximately 11.25 mm, the distance from the edge of the first anti-acid film 5 to the closest short side of the to-be-protected face 9 is approximately 10 mm, and the distances from the edge of the second anti-acid film 6 to the closest long side and the closest short side of the to-be-protected face 9 are both approximately 0.25 mm. That is, the protective film 4 has a long side size of approximately 706 mm and a short side size of approximately 612 mm, the first anti-acid film 5 has a long side size of approximately 727.5 mm and a short side size of approximately 630 mm, and the second anti-acid film 6 has a long side size of approximately 749.5 mm and a short side size of approximately 649.5 mm.

Optionally, in the display module provided by the embodiment of the present disclosure, as shown in FIG. 1 to FIG. 3, the orthographic projection of the second anti-acid film 6 on the to-be-protected face 9 may substantially or completely coincide with the to-be-protected face 9.

Specifically, in the display module provided by the embodiment of the present disclosure, the to-be-thinned substrate 2 may, for example, be a glass substrate.

Optionally, in the display module provided by the embodiment of the present disclosure, the protective film 4 may be glass spacer paper; and a material of the first anti-acid film 5 and a material of the second anti-acid film 6 may include polyethylene terephthalate.

Figure 7:
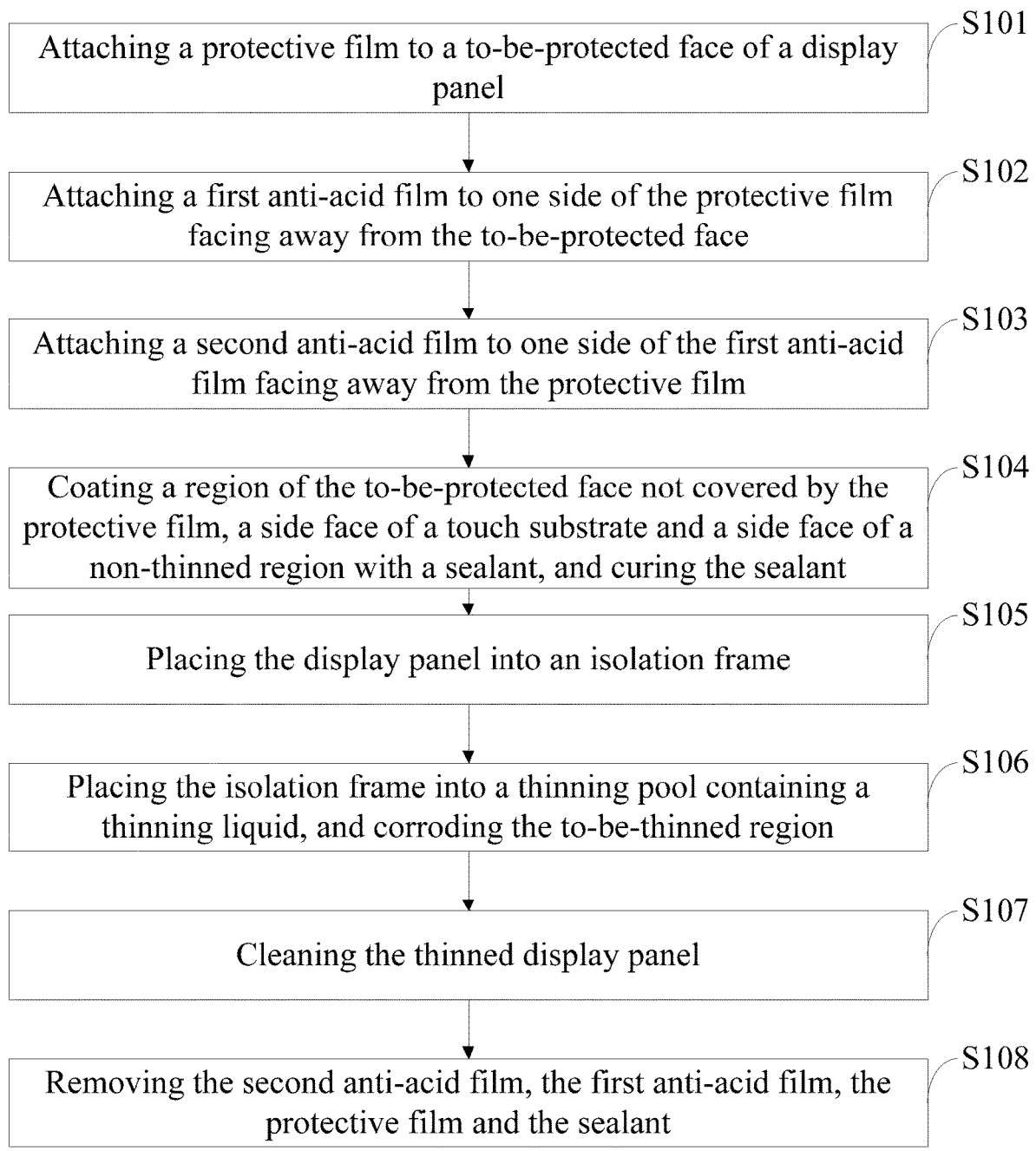
FIG. 7 is a schematic flowchart of a display panel thinning method provided by an embodiment of the present disclosure.

Based on the same inventive concept, an embodiment of the present disclosure further provides a display panel thinning method. As shown in FIG. 7, the method includes the following operations.

S101, a protective film is attached to a to-be-protected face of a display panel, where the display panel includes a to-be-thinned substrate and a touch substrate opposite to each other, the to-be-protected face is a surface of the touch substrate facing away from the to-be-thinned substrate, the to-be-thinned substrate is divided into a to-be-thinned region and a non-thinned region in a direction pointing from the to-be-thinned substrate to the touch substrate, and the protective film covers a part of the to-be-protected face.

S102, a first anti-acid film is attached to one side of the protective film facing away from the to-be-protected face, where an orthographic projection of the first anti-acid film on the to-be-protected face falls in the to-be-protected face, and an orthographic projection of the protective film on the first anti-acid film falls in the first anti-acid film.

S103, a second anti-acid film is attached to one side of the first anti-acid film facing away from the protective film, where an orthographic projection of the second anti-acid film on the to-be-protected face falls in the to-be-protected face, and an orthographic projection of the first anti-acid film on the second anti-acid film falls in the second anti-acid film.

S104, area region of the to-be-protected face not covered by the protective film, a side face of the touch substrate and a side face of the non-thinned region are coated with a sealant, and the sealant is cured.

In the display panel thinning method provided by the embodiment of the present disclosure, the protective film, the first anti-acid film and the second anti-acid film are attached to the to-be-protected face of the display panel in sequence, and the protective film may prevent the to-be-protected face from being contaminated during the attaching process of the first anti-acid film. A display module is protected by the protective film, the first anti-acid film and the second anti-acid film, thereby avoiding that acid seeps and corrodes the display module to affect a yield of products. The first anti-acid film and the second anti-acid film are attached, an area of the first anti-acid film is less than an area of the to-be-protected face, and an area of the second anti-acid film is greater than the area of the first anti-acid film, thereby further avoiding that acid seeps during the thinning process and consequently corrodes the to-be-protected face. Moreover, since the area of the first anti-acid film is less than the area of the second anti-acid film, during uniform sealant coating and curing for edge sealing after the two layers of anti-acid films are attached, the coated sealant covers a side face of the to-be-protected face and a side face of the display module, thereby further improving an edge sealing effect and preventing acid seepage. Since only one time of sealant coating and curing for edge sealing is needed, the number of times of sealant coating and curing may also be reduced, and a process flow is simplified.

Optionally, coating the region of the to-be-protected face not covered by the protective film with the sealant may further include: the region of the to-be-protected face not covered by the protective film is coated with the sealant such that the sealant completely covers a side face of the protective film and a side face of the first anti-acid film.

Optionally, coating the side face of the touch substrate and the side face of the non-thinned region with the sealant may further include: the side face of the touch substrate and the side face of the non-thinned region are coated with the sealant such that in a direction perpendicular to the to-be-protected face, a thickness of the sealant is greater than a thickness of the touch substrate, and a total thickness of the region of the display module not covered by the sealant is greater than or equal to a thickness of the to-be-thinned region.

Optionally, after curing the sealant, as shown in FIG. 7, the method may further include the following operations.

S105, the display panel is placed into an isolation frame, where the isolation frame has spacer parts, the spacer parts support the display panel on one side of the second anti-acid film facing away from the to-be-thinned region, and the spacer parts are not in contact with the to-be-thinned region.

S106, the isolation frame is placed into a thinning pool containing a thinning liquid, and the to-be-thinned region is corroded.

Optionally, placing the display panel into the isolation frame may specifically include: the plurality of display panels are placed into the same isolation frame, where the adjacent display panels are spaced by the spacer parts.

In the display panel thinning method provided by the embodiment of the present disclosure, the plurality of display panels are placed into a thinning frame and spaced by the spacer parts, and the spacer parts are not in contact with the to-be-thinned region, thereby ensuring the sufficient contact between the thinning liquid and the to-be-thinned region, and ensuring a thinning effect. Moreover, the isolation frame with the plurality of display panels therein is placed into the thinning pool containing the thinning liquid, a placing space of the display panels in the thinning pool may be partitioned by the thinning frame, thereby simultaneously performing thinning treatment on the plurality of display panels without affecting a thinning effect of each display panel, improving a thinning efficiency of the display panels, and increasing a production capacity.

Figure 8:
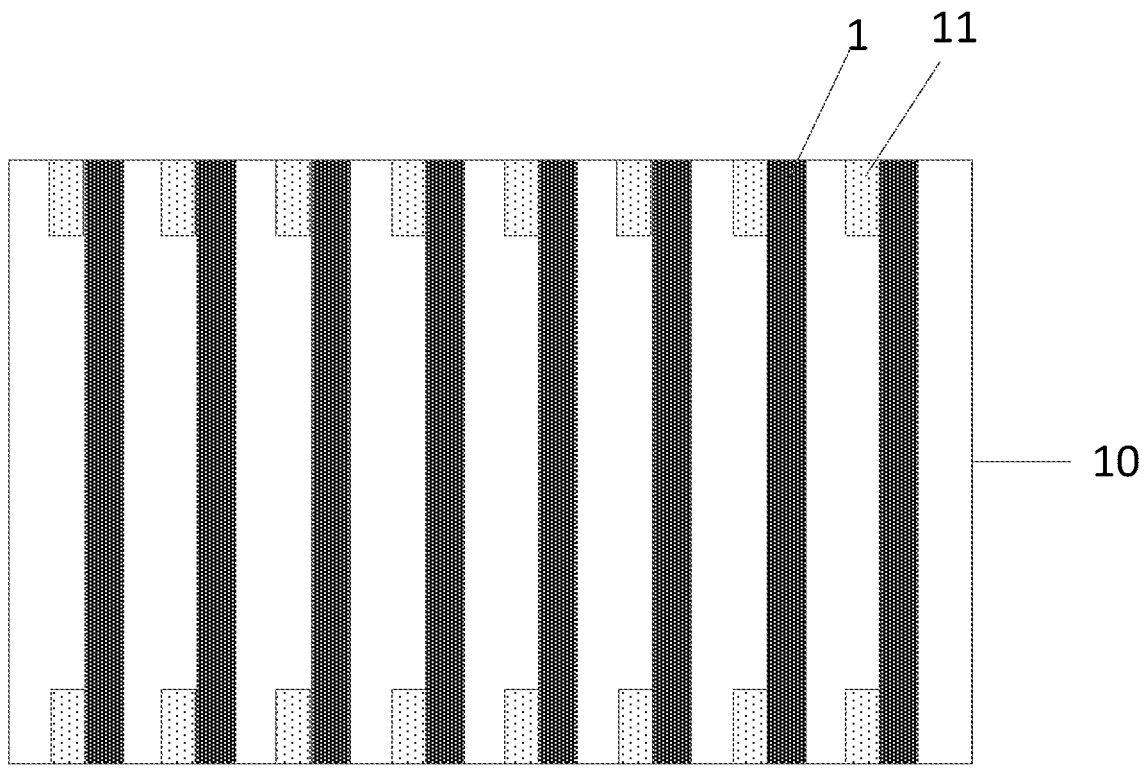
FIG. 8 is a schematic structural diagram of fixing a display panel by an isolation frame provided by an embodiment of the present disclosure.

Optionally, as shown in FIG. 8, one side of the to-be-protected face of one display panel may be provided with the two spacer parts 11, i.e., the spacer parts 11 may incompletely cover the surface of one side of the display panel 1 facing away from the to-be-thinned region, and each spacer part 11 is connected with one side face of the isolation frame 10. In FIG. 8, the spacer parts 11 are each of a quadrangular prism structure, and a surface of one side of each spacer part 11 close to the to-be-protected face 9 is parallel to the to-be-protected face 9 and is in contact with the second anti-acid film 6.

Figure 9:
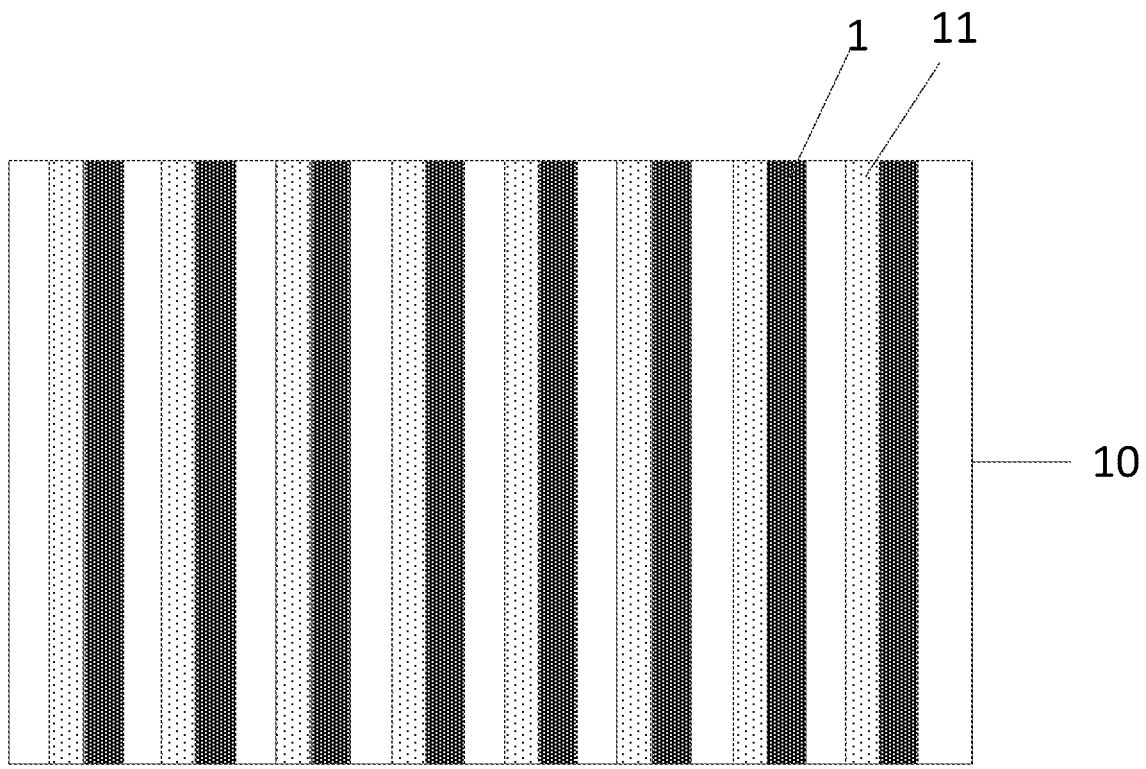
FIG. 9 is a schematic structural diagram of fixing a display panel by another isolation frame provided by an embodiment of the present disclosure.

Or optionally, as shown in FIG. 9, each spacer part 11 may be in contact with two opposite side faces of the isolation frame 10, i.e., the spacer parts 11 are each of a platy structure. In specific implementation, the spacer parts 11 may also be in other shapes if only they can space the two adjacent display panels.

Optionally, when each spacer part 11 is in contact with the two opposite side faces of the isolation frame 10, an orthographic projection of the to-be-protected face 9 of the display panel on the spacer part 11 may coincide with the spacer part 11, or the orthographic projection of the to-be-protected face 9 of the display panel on the spacer part 11 falls in the spacer part 11 and is smaller than the spacer part 11. In this case, the surface of one side of the display panel facing away from the to-be-thinned region may be in complete contact with the spacer parts 11 so as to be prevented from being in contact with the acid thinning liquid, thereby further avoiding that acid seeps and corrodes the to-be-protected face 9, and increasing a preparation yield of the display panels.

In specific implementation, due to an arrangement mode of the spacer parts 11, the to-be-thinned region may be parallel to a pair of side faces of the isolation frame 10 after the display panel is placed into the isolation frame 10, i.e., the display panel is vertically placed into the isolation frame 10. Of course, due to the arrangement mode of the spacer parts 11, the display panel may also be obliquely placed into the isolation frame 10.

Optionally, placing the isolation frame 10 into the thinning pool containing the thinning liquid may specifically include: the isolation frame 10 is placed into the thinning pool, to make an arraying direction of the display panels in the isolation frame 10 perpendicular to a liquid surface of the thinning liquid and to make the to-be-thinned region of the display panels parallel to the liquid surface of the thinning liquid.

Or optionally, placing the isolation frame is placed into the thinning pool containing the thinning liquid may specifically include: the isolation frame 10 is placed into the thinning pool, to make the arraying direction of the display panels in the isolation frame 10 parallel to the liquid surface of the thinning liquid and to make the to-be-thinned region of the display panels perpendicular to the liquid surface of the thinning liquid.

In the display panel thinning method provided by the embodiment of the present disclosure, since the arraying direction of the display panels in the isolation frame 10 is parallel to the liquid surface of the thinning liquid, a space occupied by one display panel in the thinning pool is quite small in a direction parallel to the liquid surface, one thinning pool may contain the plurality of display panels that are vertically or obliquely placed, and a large batch of display panels may be simultaneously placed into the thinning pool to be thinned, thereby improving a preparation efficiency of the display panels, and increasing a production capacity.

For example, more than 100 display panels may be placed simultaneously in the isolation frame 10 provided by the embodiment of the present disclosure. A material of the isolation frame 10 is selectively an anti-acid material, and may for example be polyethylene. The thinning liquid in the thinning pool may include hydrogen fluoride (HF), and may further include a sulfuric acid ($H_2SO_4$).

Optionally, after corroding the to-be-thinned region, as shown in FIG. 7, the method may further include the following operations.

S107, the thinned display panel is cleaned.

S108, the second anti-acid film, the first anti-acid film, the protective film and the sealant are removed.

A cleaning process may for example be a simple water washing process if only foreign matter and acid thinning liquid left on a thinned surface of the display panel can be removed. After water washing, the second anti-acid film, the first anti-acid film and the protective film may be torn off, and the sealant may be scrapped off through a knife.

Based on the same inventive concept, an embodiment of the present disclosure further provides a display panel, which is obtained after the to-be-thinned region is thinned by the display panel thinning method provided by the embodiment of the present disclosure.

Based on the same inventive concept, an embodiment of the present disclosure further provides a display device. The display device includes the display panel provided by the embodiment of the present disclosure. The display device provided by the embodiment of the present disclosure may for example be a cell phone, a tablet, a TV, etc.

In conclusion, in the display module, the display panel thinning method, the display panel, and the display device provided by the embodiments of the present disclosure, the protective film, the first anti-acid film and the second anti-acid film are attached to the to-be-protected face of the display panel in sequence, and the protective film may prevent the to-be-protected face from being contaminated during the attaching process of the first anti-acid film. The first anti-acid film and the second anti-acid film are attached, the area of the first anti-acid film is less than the area of the to-be-protected face, and the area of the second anti-acid film is greater than the area of the first anti-acid film, thereby further avoiding that acid seeps during the thinning process and consequently corrodes the to-be-protected face. Moreover, since the area of the first anti-acid film is less than the area of the second anti-acid film, during uniform sealant coating and curing for edge sealing after the two layers of anti-acid films are attached, the coated sealant may cover the side face of the to-be-protected face and the side face of the display module for the touch substrate while preventing the thinning liquid from corroding the section of the region not needing to be thinned, thereby further improving the edge sealing effect and preventing acid seepage. Since only one time of sealant coating and curing for edge sealing is needed, the number of times of sealant coating and curing may also be reduced, and the process flow is simplified.

It will be apparent to those skilled in the art that various modifications and variations can be made to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A display module, comprising:
   a display panel, comprising a to-be-thinned substrate and a touch substrate opposite to each other, wherein a surface of the touch substrate facing away from the to-be-thinned substrate is a to-be-protected face, and the to-be-thinned substrate is divided into a to-be-thinned region and a non-thinned region in a direction pointing from the to-be-thinned substrate to the touch substrate;
   a protective film, located on the to-be-protected face of the display panel, wherein the protective film covers a part of the to-be-protected face;
   a first anti-acid film, located on a surface of one side of the protective film facing away from the to-be-protected face, wherein an orthographic projection of the first anti-acid film on the to-be-protected face falls in the to-be-protected face, and an orthographic projection of the protective film on the first anti-acid film falls in the first anti-acid film;
   a second anti-acid film, located on a surface of one side of the first anti-acid film facing away from the to-be-protected face, wherein an orthographic projection of the second anti-acid film on the to-be-protected face falls in the to-be-protected face, and an orthographic projection of the first anti-acid film on the second anti-acid film falls in the second anti-acid film; and
   a sealant, covering a region of the to-be-protected face not covered by the protective film, a side face of the touch substrate and a side face of the non-thinned region.

2. The display module according to claim 1, wherein the orthographic projection of the protective film on the first anti-acid film falls in the first anti-acid film and is smaller than the first anti-acid film; and
   the orthographic projection of the first anti-acid film on the second anti-acid film falls in the second anti-acid film and is smaller than the second anti-acid film.

3. The display module according to claim 2, wherein the sealant completely covers a side face of the protective film and a side face of the first anti-acid film; and
   a space between a region of the first anti-acid film not covered by the protective film and the to-be-protected face is filled with the sealant; and a space between a region of the second anti-acid film not covered by the first anti-acid film and the to-be-protected face is filled with the sealant.

4. The display module according to claim 1, wherein in a direction perpendicular to the to-be-protected face, a thickness of the sealant is greater than a thickness of the touch substrate, and a total thickness of a region of the display module not covered by the sealant is greater than or equal to a thickness of the to-be-thinned region.

5. The display module according to claim 2, wherein the to-be-protected face has first sides parallel to a first direction and second sides parallel to a second direction;
   a distance from an edge of the protective film to a closest first side is approximately: 17-27 mm, and a distance from an edge of the protective film to a closest second side is approximately: 14-24 mm; and
   the first direction and the second direction cross each other.

6. The display module according to claim 5, wherein a distance from an edge of the first anti-acid film to a closest first side is approximately: 2-18 mm, and a distance from an edge of the first anti-acid film to a closest second side is approximately: 2-20 mm.

7. The display module according to claim 5, wherein a distance from an edge of the second anti-acid film to a closest first side is approximately less than or equal to 0.5 mm, and a distance from an edge of the second anti-acid film to a closest second side is approximately less than or equal to 0.5 mm.

8. The display module according to claim 7, wherein the orthographic projection of the second anti-acid film on the to-be-protected face coincides with the to-be-protected face.

9. The display module according to claim 1, wherein the protective film is glass spacer paper; and a material of the first anti-acid film and a material of the second anti-acid film comprise polyethylene terephthalate.

10. A display panel thinning method, comprising:
    attaching a protective film to a to-be-protected face of a display panel, wherein the display panel comprises: a to-be-thinned substrate and a touch substrate opposite to each other, the to-be-protected face is a surface of the touch substrate facing away from the to-be-thinned substrate, the to-be-thinned substrate is divided into a to-be-thinned region and a non-thinned region in a direction pointing from the to-be-thinned substrate to the touch substrate, and the protective film covers a part of the to-be-protected face;
    attaching a first anti-acid film to one side of the protective film facing away from the to-be-protected face, wherein an orthographic projection of the first anti-acid film on the to-be-protected face falls in the to-be-protected face, and an orthographic projection of the protective film on the first anti-acid film falls in the first anti-acid film;
    attaching a second anti-acid film to one side of the first anti-acid film facing away from the protective film, wherein an orthographic projection of the second anti-acid film on the to-be-protected face falls in the to-be-protected face, and an orthographic projection of the first anti-acid film on the second anti-acid film falls in the second anti-acid film; and
    coating a region of the to-be-protected face not covered by the protective film, a side face of the touch substrate and a side face of the non-thinned region with a sealant, and curing the sealant.

11. The method according to claim 10, wherein the coating the region of the to-be-protected face not covered by the protective film with the sealant further comprises:
    coating the region of the to-be-protected face not covered by the protective film with the sealant such that the sealant completely covers a side face of the protective film and a side face of the first anti-acid film.

12. The method according to claim 10, wherein the coating the side face of the touch substrate and the side face of the non-thinned region with the sealant further comprises:

coating the side face of the touch substrate and the side face of the non-thinned region with the sealant such that in a direction perpendicular to the to-be-protected face, a thickness of the sealant is greater than a thickness of the touch substrate, and a total thickness of a region of the display module not covered by the sealant is greater than or equal to a thickness of the to-be-thinned region.

13. The method according to claim 10, wherein after curing the sealant, the method further comprises:
placing the display panel into an isolation frame, wherein the isolation frame has spacer parts, the spacer parts support the display panel on one side of the second anti-acid film facing away from the to-be-thinned region, and the spacer parts are not in contact with the to-be-thinned region; and
placing the isolation frame into a thinning pool containing a thinning liquid, and corroding the to-be-thinned region.

14. The method according to claim 13, wherein the placing the display panel into the isolation frame further comprises:
placing a plurality of display panels into a same isolation frame, wherein adjacent display panels are spaced by the spacer parts.

15. The method according to claim 13, wherein after corroding the to-be-thinned region, the method further comprises:
cleaning the thinned display panel; and
removing the second anti-acid film, the first anti-acid film, the protective film and the sealant.

16. A display panel, wherein the display panel is obtained after the to-be-thinned region is thinned by the method according to claim 10.

17. A display device, comprising the display panel according to claim 16.

* * * * *